United States Patent
Dimri et al.

(10) Patent No.: US 11,978,738 B2
(45) Date of Patent: May 7, 2024

(54) DIGITAL BLOCKS WITH ELECTRICALLY INSULATED AND ORTHOGONAL POLYSILICON LAYERS

(71) Applicant: TEXAS INSTRUMENTS INCORPORATED, Dallas, TX (US)

(72) Inventors: Rakesh Dimri, Bangalore (IN); Senthil Kumar Sundaramoorthy, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 250 days.

(21) Appl. No.: 15/840,335

(22) Filed: Dec. 13, 2017

(65) Prior Publication Data

US 2019/0181153 A1 Jun. 13, 2019

(51) Int. Cl.
| | |
|---|---|
| H01L 27/118 | (2006.01) |
| H01L 21/8234 | (2006.01) |
| H01L 21/8238 | (2006.01) |
| H01L 23/522 | (2006.01) |
| H01L 23/528 | (2006.01) |
| H01L 23/532 | (2006.01) |
| H01L 27/02 | (2006.01) |

(52) U.S. Cl.
CPC ............ *H01L 27/11807* (2013.01); *H01L 21/823828* (2013.01); *H01L 21/823871* (2013.01); *H01L 23/5221* (2013.01); *H01L 23/5286* (2013.01); *H01L 23/53271* (2013.01); *H01L 27/0207* (2013.01); *H01L 21/823475* (2013.01); *H01L 2027/11866* (2013.01); *H01L 2027/11875* (2013.01); *H01L 2027/11881* (2013.01); *H01L 2027/11885* (2013.01)

(58) Field of Classification Search
CPC ........... H01L 27/11807; H01L 23/5221; H01L 23/5286; H01L 23/53271; H01L 21/823828
See application file for complete search history.

(56) References Cited

U.S. PATENT DOCUMENTS

| | | | | |
|---|---|---|---|---|
| 5,854,566 | A * | 12/1998 | Kwon | H03K 17/693 327/403 |
| 2010/0227131 | A1* | 9/2010 | Yang | H01L 22/34 428/198 |
| 2011/0222003 | A1* | 9/2011 | Kinoe | G02F 1/133512 349/104 |
| 2013/0228877 | A1* | 9/2013 | Sugimoto | H01L 27/088 257/401 |
| 2016/0379562 | A1* | 12/2016 | Yoon | H01L 29/42384 345/215 |
| 2017/0059908 | A1* | 3/2017 | Yen | G02F 1/1368 |
| 2017/0117223 | A1* | 4/2017 | Azmat | H01L 27/0207 |

(Continued)

*Primary Examiner* — Phat X Chao
(74) *Attorney, Agent, or Firm* — Andrew R. Ralston; Frank D. Cimino

(57) ABSTRACT

A device comprising a semiconductor substrate. The device also comprising a digital block defined on the substrate and having multiple electronic elements. The device also comprises first and second poly layers coupling to the multiple electronic elements, the first and second poly layers extending in parallel through the digital block in a first direction. The device further comprising a third poly layer coupled to the first poly layer and extending through a gap in the second poly layer in a second direction orthogonal to the first direction poly.

16 Claims, 4 Drawing Sheets

(56) References Cited

U.S. PATENT DOCUMENTS

2017/0287844 A1* 10/2017 Or-Bach ............... H01L 23/544
2018/0286936 A1* 10/2018 Lee .................... H01L 27/1255
2019/0033647 A1* 1/2019 Yang ................ G02F 1/133345

* cited by examiner

US 11,978,738 B2

DIGITAL BLOCKS WITH ELECTRICALLY INSULATED AND ORTHOGONAL POLYSILICON LAYERS

BACKGROUND

From a layout perspective, an integrated circuit (IC) may include multiple digital blocks, with each digital block performing some logical function. The cost of fabricating an IC may depend on the number of levels of metal layers that are utilized to route the electronic elements present in the digital blocks. In some cases, double or triple levels of metal layers are used to route the electronic elements present in the digital blocks. In order to reduce the cost, optimizing and finding techniques to reduce the number of metal layers is desirable.

SUMMARY

According to an example, a device comprising a semiconductor substrate, a digital block defined on the substrate and having multiple electronic elements. The device also comprises first and second poly layers coupling to the multiple electronic elements, the first and second poly layers extending in parallel through the digital block in a first direction. The device further comprising a third poly layer coupled to the first poly layer and extending through a gap in the second poly layer in a second direction orthogonal to the first direction poly.

According to another example, a system comprising a semiconductor substrate, a digital block defined on the substrate, the digital block comprising a plurality of electronic elements. The system also comprising a first layer extending through the digital block in a first level in a first direction and having first and second portions with a gap therebetween. The system further comprising a second layer in the first level and extending through the digital block and the gap in a second direction orthogonal to the first direction. The system also comprising a third layer in a second level above the first level, the third layer electrically coupling the first and second portions.

According to yet another example, a method comprising forming a first poly layer in a digital block such that the first poly layer comprises separate portions. The method also comprising forming a second poly layer in the digital block between the separate portions, the first poly layer orthogonal to the second poly layer. The method further comprising forming a met layer bridge in the digital block over the second poly layer such that the separate portions are electrically coupled to each other and such that the met layer bridge is electrically isolated from the second poly layer.

BRIEF DESCRIPTION OF THE DRAWINGS

For a detailed description of various examples, reference will now be made to the accompanying drawings in which.

DETAILED DESCRIPTION

Figure 1:
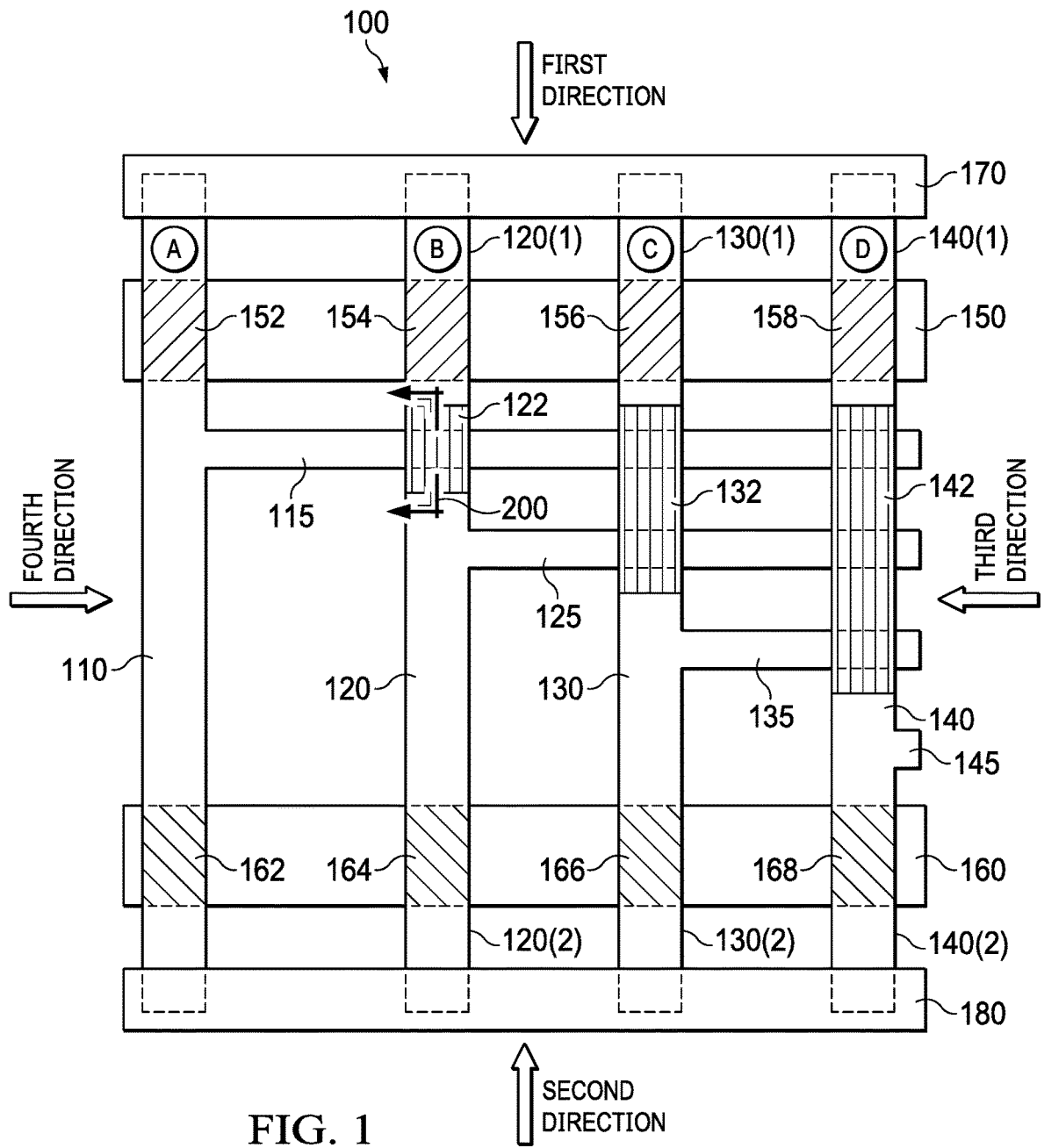
FIG. 1 is an illustrative layout of an example digital block, in accordance with various examples.

The semiconductor industry employs a cell-based methodology in order to segregate the logical aspect and the physical aspect of an IC. The cell-based methodology makes it possible for one designer to simulate (on a computer system) the design of an IC from a high-level (logical function), while another designer focuses on the implementation aspect of the logical design. The cell-based methodology assists in modularizing the logical function (e.g., muxed D-input flipflop) of an IC into multiple smaller logical functions (e.g., NAND). The cell-based methodology does so by using multiple digital blocks (also referred to as "standard cells"), each of which can perform a modularized logical function. The multiple digital blocks may operate in tandem to perform the more complex logical function (e.g., muxed D-input flipflop). A single digital block may generally be described as a group of electronic elements (e.g., transistors) that work together to perform one or more logical functions. A digital block may include the substrate, elements formed within the substrate and on the substrate (e.g., poly layers), and elements (e.g., metal layers) extending above and across the substrate. A digital block may be readily identifiable on a circuit layout. For example, a circuit layout may represent a digital block using a rectilinear object that represents a group of electronic elements that work together to perform one or more logical functions. However, from a fabrication standpoint, a digital block may not necessarily be neatly circumscribed within rectilinear borders. In such cases, a digital block on a fabricated IC may be identified using the corresponding circuit layout and/or the mask(s) that were used in tandem with the layout to fabricate the IC. The presence of electronic elements in a digital block and the use of multiple digital blocks necessitate employing multiple levels of routing layers that transport signal between multiple digital blocks.

Depending on the number of digital blocks and the complexity of the logical function to be performed, a logical design may employ double or triple levels of metal layers (or "met" layers) for routing purposes. In order to route signals between the digital blocks, each of the digital blocks needs to have at least one level of met layer that is accessing the digital block so as to transport signals from one digital block to another digital block. However, in order to efficiently route signals between the digital blocks, a met layer needs the flexibility to access a digital block from multiple directions. In other words, the greater the number of access ports (i.e., positions through which a met layer can access a digital block), the easier it is to design a routable layout.

In some cases, multiple digital blocks performing a logical function may employ a design that uses multiple levels of metal layers for routing purposes. Reducing the number of levels of met layers decreases costs due to the number of masks that must be used during manufacture, but reducing the number of met layers may also yield an unrouteable design. Thus, there is a need in the art to develop standard cell architecture that uses a reduced number of levels of met layers to route multiple digital blocks, thereby reducing manufacturing costs.

Accordingly, at least some of the examples disclosed herein are directed to systems and methods for employing a met layer to route a layer in a lower level in a manner that permits the lower level to route signals in multiple (e.g., orthogonal) directions without short-circuiting. For example, a first polylayer extending in a first direction on the substrate level may be divided into two portions, with a second poly layer on the substrate level passing between the two portions and in a second direction that is orthogonal to the first direction. The two portions of the first poly layer may be electrically coupled to each other using a met layer in a level above the layers—for example, a met layer in the met 1 level, a met layer in the met 2 level, a met layer in the met 3 level, or any other suitable layer at any suitable level. In another example, a met layer extending in a first direction in the met 1 level may be divided into two portions, with a second met layer in the met 1 level passing between the two portions and in a second direction orthogonal to the first direction. The two portions of the first met layer may be electrically coupled to each other using a met layer in a level above the met 1 level—for example, a met layer in the met 2 level, a met layer in the met 3 level, etc. In some examples, a layer may be divided into more than two portions, with the foregoing routing technique used multiple times on that layer. This technique reduces the number of met layers used in a design while increasing routing flexibility in one or more layer levels, thus preserving routeability while reducing costs. The bulk of this disclosure provides examples in the context of met layers in a met 1 level being used to increase routing flexibility in poly layers on a substrate level, but, as explained above, the scope of disclosure encompasses the use of layers in any level to increase routing flexibility in layers on a lower level.

FIG. 1 is an illustrative layout of an example digital block 100. The digital block 100 is designed to perform a logical function and is further designed to facilitate the use of one or more poly layers as routing layers between the digital block 100 and one or more other digital blocks. FIG. 1, for simplicity's sake, depicts the digital block 100 to be in a rectangular shape. However, in other examples, the digital block 100 can assume any rectilinear shape. FIG. 1 depicts a first power rail 170 and a second power rail 180. The first power rail 170 can either be a power rail with a finite potential providing a power source to the digital block 100 or a ground rail providing a ground source to the digital block 100. Depending on the type of the first power rail 170, the power rail 180 assumes the other type, i.e., if the power rail 170 provides power, the power rail 180 may then be the ground (and vice-versa). Both the power rails 170 and 180 facilitate power supply to the digital block 100.

The architecture described in FIG. 1 utilizes poly layers for different functionalities. For example, some poly layers (such as the poly port layers 110, 120, 130, 140 running parallel to each other) are inherently present in a digital block and such poly layers are not only used to control the gates of transistors, but also as routing layers. However, some poly layers are utilized only for routing purposes (such as the poly access layers 115, 125, 135, and 145 running parallel to each other). The poly access layers 115, 125, 135, and 145 facilitate local signal routing (i.e., inside a digital block). The poly global routing layer 370 (further described in FIG. 3) facilitates global routing between multiple digital blocks. The poly port layers 120, 130, and 140 include multiple portions. For example, the poly port layer 120 includes a first poly port portion 120(1), a met layer 122, and a second poly port portion 120(2). The poly port layer 130 includes a first poly port portion 130(1), a met layer 132, and a second poly port portion 130(2). The poly port layer 140 includes a first poly port portion 140(1), a met layer 142, and a second poly port portion 140(2). As further described below, these separate portions facilitate employing a single level of met layers for signal routing between multiple digital blocks. From a device fabrication standpoint, the poly layers (poly port layers, poly access layers, and poly global routing layers) are present in the same plane such that two intersecting poly layers may result in a short circuit. The met layers are present on a plane above the plane of poly layers.

FIG. 1 further includes multiple active layers 150 and 160, each of which represents a diffused region that is doped with either a group III (p-doped) or a group V (n-doped) dopant. From a fabrication perspective, the active layers 150, 160 are present in a plane below the plane of the poly layers. From a layout perspective, a transistor may form at a position where a poly layer crosses the path of a diffused layer. For example, multiple poly port layers 110, 120, 130, 140 cross the path of the diffused layers 150 and 160 to form multiple transistors 152, 154, 156, 158, 162, 164, 166, and 168. The type of transistor formed at the point of crossing depends on the type of dopant (p-type or n-type), i.e., if a poly port layer crosses the path of an n-type dopant doped active region, it will form an n-type transistor (and vice versa).

FIG. 1 also depicts input pins A, B, C, D that provide access to one or more transistors via the poly port layer. In this disclosure, the input pins A, B, C, D are stated for representational purposes, i.e., input pins A, B, C, D represent a layer through which multiple electronic elements performing some logical function may be accessed. In some examples, the poly port layers 110, 120, 130, 140 may act as the input pins A, B, C, and D (respectively). For instance, input pin A (or the poly port layer 110) provides access to the gates of the transistors 152, 162; input pin B (or the poly port layer 120) provides access to the gates of the transistors 154, 164; input pin C (or the poly port layer 130) provides access to the gates of the transistors 156, 166; and input pin D (or the poly port layer 140) provides access to the gates of the transistors 158, 168. For simplicity's sake, only four input pins are described, but other examples may include more number of pins. In some examples, the number of pins may vary per the complexity of the logical function performed by the digital block 100.

FIG. 1 further describes accessing the input pins A, B, C, and D from different directions, i.e., first direction, second direction, third direction, and fourth direction. The greater the number of the directions through which the input pins A, B, C, and D may be accessed, the easier it is to design a layout. Assume that each of the poly port layers 120, 130, and 140 is made up of a uniform polysilicon layer, i.e., each of the poly port layers 120, 130, and 140 does not include any separate portion, and is made up of a single uniform layer of polysilicon (without the presence of met layers 122, 132, and 142). In such a case, the number of directions through which input pins A, B, C, D may be accessed is limited. For instance, access to input pin A is limited to three directions, i.e., the first direction, the second direction, and the fourth direction. The input pin A is inaccessible from the third direction because attempting to provide access to the input pin A from the third direction using the poly access layer 115 may result in a short circuit at points of intersection of poly access layer 115 and the poly port layers 120, 130, 140. Similarly, accessing the input pin D is also limited to three directions i.e., the first direction, the second direction, and the third direction. Because of similar reasons, the input pin D is inaccessible from the fourth direction as attempting to provide access to the input pin D from the fourth direction using a poly access layer may result in a short circuit at multiple points.

Further, in such a case, accessing the input pins B and C is limited to two directions (i.e., the first direction and the second direction). For example, attempting to provide access to the input pin B from the third direction using the poly access layer 125 may result in short circuits at multiple points of intersection of poly access layer 125 and the poly port layers 130 and 140, and access from the fourth direction is limited because of a possibility of creating a short circuit condition at the poly port layer 110. Similarly, attempting to provide access to the input pin C from the third direction using the poly access layer 125 may result in a short circuit at the intersection of poly access layer 125 and the poly port layers 130, 140.

As stated above, to overcome this short circuit issue, the digital block 100 includes poly port layers 120, 130 and 140 that include multiple different portions. The met layers 122, 132, and 142 assist the poly access layers 115, 125, 135 and 145 in providing access to input pins A, B, C, D from additional directions by preventing the aforementioned short-circuit conditions. Stated another way, the met layers 122, 132, and 142 provide insulation to the poly access layers 115, 125, 135, and 145 that are accessing, in this example, the poly port layers 110, 120, 130, and 140 (respectively) from the third direction.

For example, the met layer 142 forms a portion of the poly port layer 140 and the poly port layer 140 includes three portions, i.e., the first poly port layer 140(1), the second poly port layer 140(2)), and the met layer (142). The met layer 142 electrically couples with the first poly port layer 140(1) and the second poly port layer 140(2). Since the met layer 142 is positioned in a plane above the plane of the poly access layer 135, the input pin C may now be accessed using the third direction. This vertical offset between the poly layers and the met layers provides the aforementioned insulation.

Figure 2A:
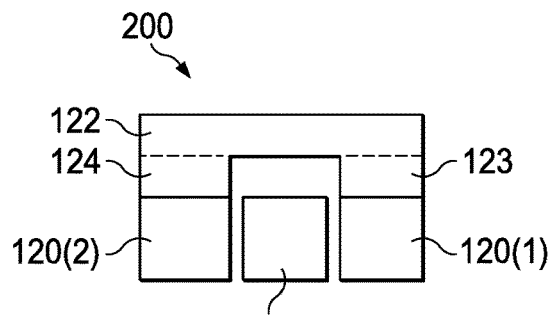
FIGS. 2A-D are cross-sectional side-views along the line 200 in FIG. 1, in accordance with various examples.

FIG. 2a is a cross-sectional side-view along the line 200 (FIG. 1) from the perspective of the third direction. FIG. 2a depicts (from a fabrication perspective) the position of the met layer 122 with respect to the poly access layer 115. FIG. 2a depicts a first portion 120(1) and a second portion 120(2) of the poly port layer 120 (FIG. 1), and first and second vias 123 and 124 (sometimes referred to as contacts) respectively connecting the first portion 120(1) and the second portion 120(2) to the met layer 122. The poly access layer 115 and the first and second portions 120(1) and 120(2) are positioned on the surface (also referred to as substrate level) of the substrate 201. As mentioned above and as shown in FIG. 2a, the met layers occupy one horizontal plane and the poly layers occupy a different horizontal plane. In some examples, there may be no intervening levels of layers (such as another layer of met layer) between the met layer 122 (or the met bridge) and the first and second portions 120(1) and 120(2). As noted in FIG. 1, the met layer 122 is used to prevent a short circuit condition which would have developed if the poly port layer 120 was monolithic and did not include multiple portions with the architecture shown in FIG. 2a.

Figure 2B:
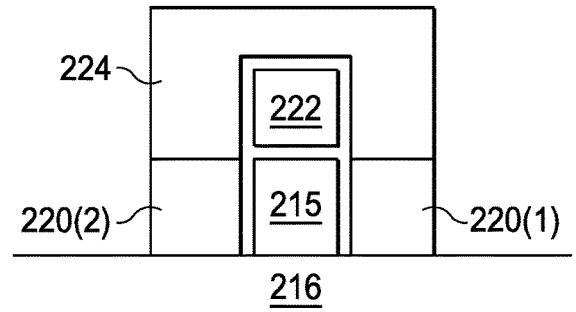

As explained above, the scope of this disclosure encompasses examples in which layers of any level are usable to increase routing flexibility in layers of a lower level. FIG. 2b depicts an example in which a met layer (or a met bridge) in the met 2 level is used to increase routing flexibility in the poly layers at the substrate level. In particular, FIG. 2b depicts a first portion 220(1) and a second portion 220(2) of a poly port layer and a poly access layer 215 extending through the gap between the portions 220(1), 220(2) in a direction orthogonal to that in which the portions 220(1), 220(2) extend. Both poly layers are positioned in the substrate level (i.e., on the surface of the substrate 216). A met layer 222 in the met 1 level is positioned above the poly layers. A met layer 224 in the met 2 level is positioned above the met layer 222. (A dielectric material may be positioned in the areas between layers to prevent unwanted electrical contact and to reduce parasitic capacitance.) The met layer 224 electrically couples the first portion 220(1) and the second portion 220(2). In this way, poly layers in the substrate level are able to extend in orthogonal directions, thus increasing routing flexibility in the substrate level.

Figure 2C:
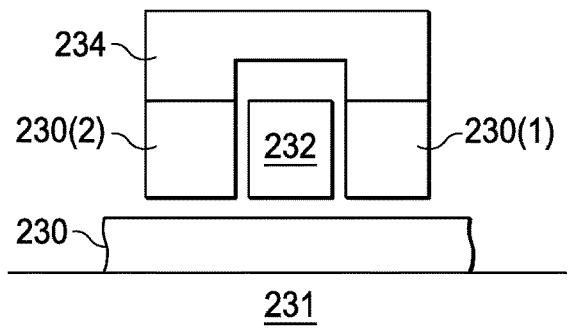

Similarly, FIG. 2c depicts an example in which a met layer in the met 2 level is used to increase routing flexibility in the met layers in the met 1 level. In particular, FIG. 2c depicts a first portion 230(1) and a second portion 230(2) of a met layer in the met 1 level. Another met layer 232 in the met 1 level extends through the gap between the first and second portions 230(1), 230(2) in a direction orthogonal to that in which the first and second portions 230(1), 230(2) extend. A met layer 234 in the met 2 level electrically couples the portions 230(1), 230(2), thus increasing routing flexibility in the met 1 level. A poly layer 230 may be present in the substrate level (i.e., positioned on a surface of the substrate 231), as shown. FIGS. 2a-2c are merely illustrative of the various ways in which a higher-level layer can be used to increase routing flexibility in layers of a lower level, all of which are included in the scope of this disclosure.

Figure 2D:
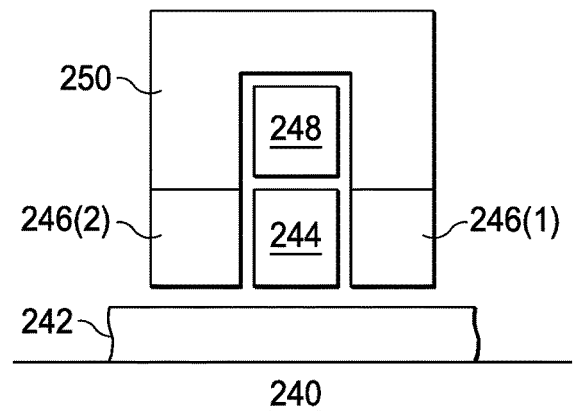

Similarly, FIG. 2d depicts an example in which a met layer in the met 3 level is used to increase routing flexibility in the met layers in the met level 1 and/or 2. In particular, FIG. 2d depicts a first portion 246(1) and a second portion 246(2) of a met layer in the met 1 level. Another met layer 244 in the met 1 level extends through the gap between the first and second portions 246(1), 246(2) in a direction orthogonal to that in which the first and second portions 246(1), 246(2) extend. Yet another met layer 248 in the met 2 level extends through the gap between the first and second portions 246(1), 246(2) in a direction orthogonal to that in which the first and second portions 246(1), 246(2) extend. A met layer 250 in the met 3 level electrically couples the portions 246(1), 246(2), thus increasing routing flexibility in the met 1 and/or 2 levels. A poly layer 242 may be present in the substrate level (i.e., positioned on a surface of the substrate 231), as shown. Therefore, in some examples, there may exist one intervening level (met layer 248) between two different levels.

Referring back to FIG. 1, a similar principle can be applied to gain access to other input pins from other directions. For example, the met layer 132 may permit the poly access layer 125 to access the input pin B from the third direction, and the met layer 122 may permit the poly access layer 115 to access the input pin A from the third direction The scope of this application, however, is not limited to using met layers 122, 132, and 142 to provide access to input pins from the third direction. In other examples, met layers 122, 132, and 142 can be used on poly port layers 110, 120, and 130, respectively, so as to provide access to the input pins B, C, and D from the fourth direction. In some examples, access from any given direction can be provided using a met layer instead of using a poly access layer. For instance, providing access to the port D from the fourth direction may include using an additional met layer connected to the poly port layer 140 and running over poly port layer 130, poly port layer 120 and poly port layer 110 to provide access to poly port layer 140 from the fourth direction.

So far, this disclosure describes the use of met layers to increase the number of directions from which input pins may be accessed. As noted above, designing a logical function may include more than one digital block. For that reason, a global architecture layout is now described. The global architecture layout employs met layers and poly layers as global routing layers.

Figure 3:
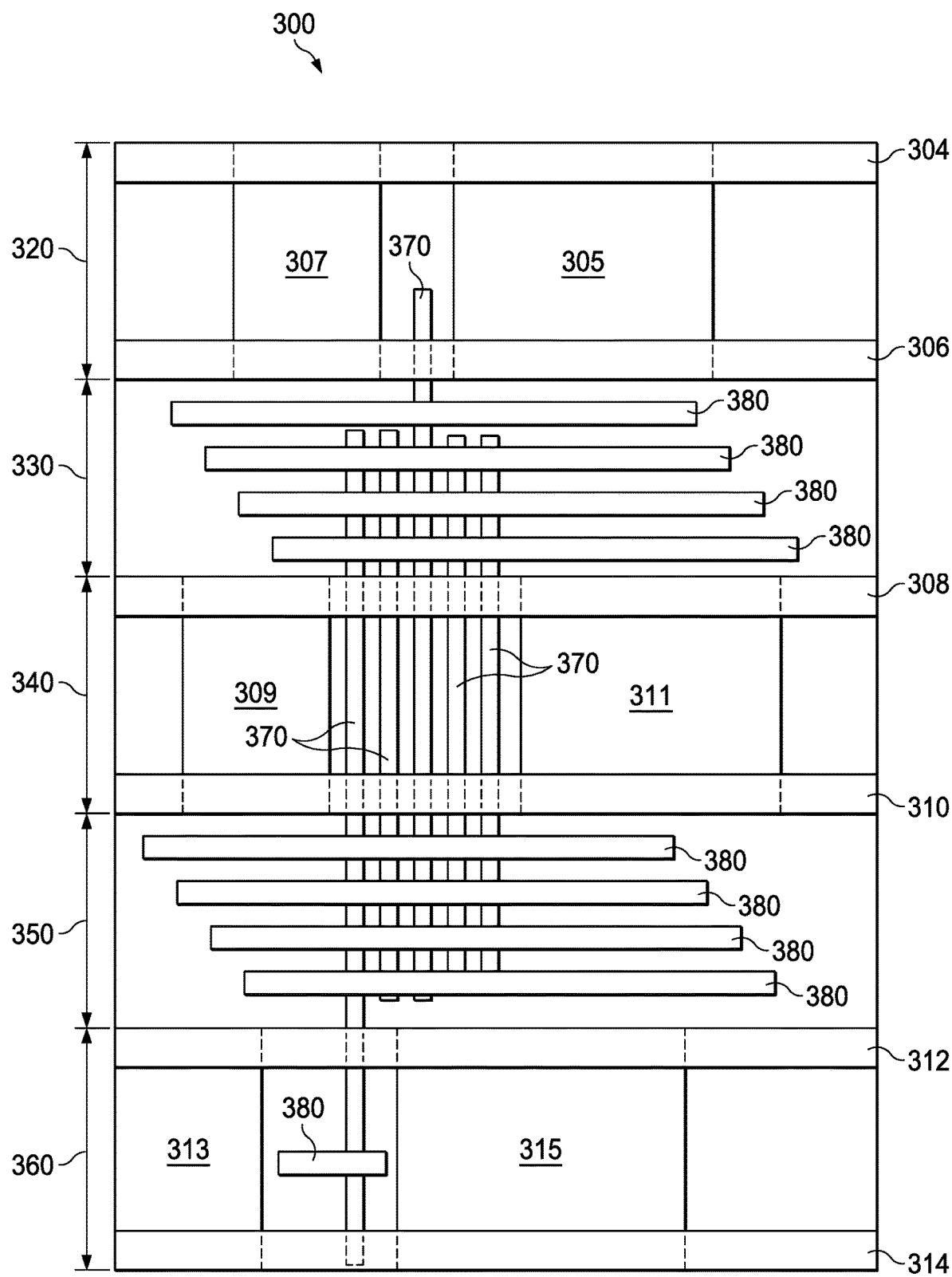
FIG. 3 shows an illustrative digital block area, in accordance with various examples.

FIG. 3 is an illustrative digital block area 300 that employs both met layers and poly layers to transport signals between multiple digital blocks. In some examples, digital block area 300 may include multiple digital blocks that collectively perform a logical function. FIG. 3 includes multiple different regions, such as regions 320, 330, 340, 350, and 360. Regions 320, 340, and 360 are the positions in the digital block area 300 that include multiple digital blocks 305, 307, 309, 311, 313, and 315. FIG. 3 also depicts multiple poly global routing layers 370. Each layer 370 runs parallel to the remaining layers 370. One or more of the layers 370 runs between two digital blocks, such as digital blocks 305 and 307, digital blocks 309 and 311, and digital blocks 313 and 315. Regions 330 and 350 are separate regions that provide channels for the met routing layers 380. The met routing layers 380 (which run in parallel with each other) and the poly routing layers 370 (which also run in parallel with each other) are orthogonal to each other. Although FIG. 3 depicts the met routing layers 380 running horizontally, in some examples, the met routing layers 380 may switch positions with the poly routing layers 370 and run vertically. In such examples, the poly routing layers 370 may run horizontally in the regions 330, 350.

The regions 320, 340, and 360 further include first power rails 304, 308, and 312, respectively. The regions 320, 340, and 360 also include second power rails 306, 310, and 314, respectively. The first and second power rails provide power to the digital blocks present in the regions 320, 340, and 360. Similar to the power rails described in FIG. 1, the first power rail may include a high-potential rail, which is configured to receive a finite level of power and the second power rail may include a ground rail. In other examples, the first power rail may include a ground rail and the second power rail may include a high potential rail, which is configured to receive a finite level of power.

As noted above in FIG. 1, the digital block 100 can be configured such that the poly access layers can access the cell ports from the first, second, third, and fourth directions. Similar to the digital block 100, the multiple digital blocks 305, 307, 309, 311, 313, 315 (FIG. 3) can also be configured to include poly port layers and poly access so as to provide cell port access in the first direction, the second direction, the third direction, and the fourth direction. With this enhanced flexibility of accessing a digital block from multiple directions, poly routing layers 370 can be used as a global routing layer.

Figure 4:
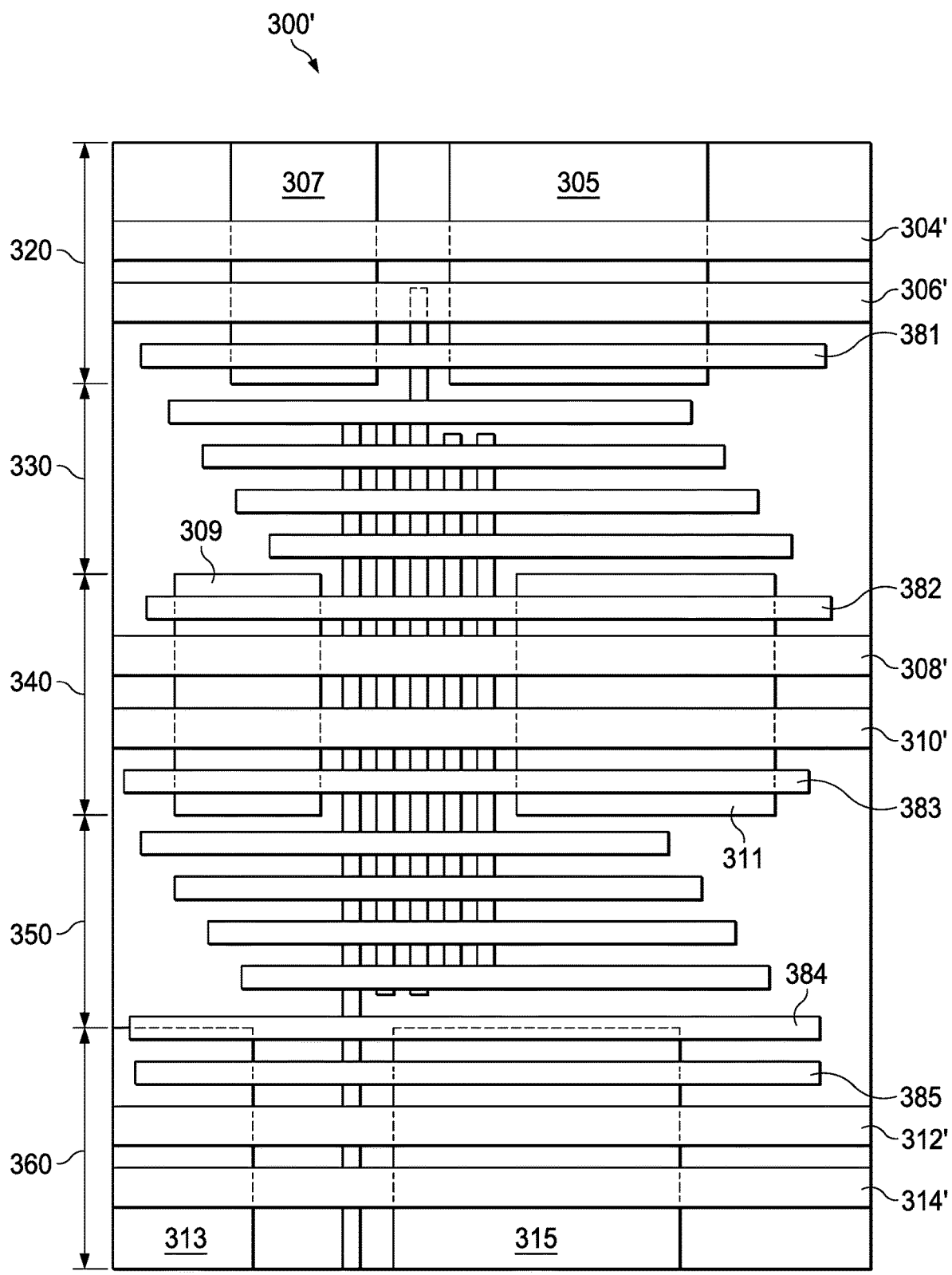
FIG. 4 is a modified version of the illustrative digital block area of FIG. 3.

In some examples, the digital block area 300 may need additional met routing layers beyond the met routing layers present in the regions 330 and 350. For such examples, the digital block area can be further configured to provide additional met routing layers, as depicted in the modified digital block area of FIG. 4. FIG. 4 is a modified version of FIG. 3 and is adjusted with respect to the position of power rails 304, 306, 308, 310, 312, and 314. As mentioned above, some examples may require additional met routing layers. The power rails 304', 306', 308', 310', 312', and 314' in the modified digital block area 400 assume positions closer to the center of each of the multiple digital blocks 305, 307, 309, 311, 313, 315. Positioning the power rails 304', 306', 308', 310', 312', and 314' toward the center provides extra room for the additional met routing layers 381, 382, 383, 384 and 385. The additional met routing layers 381, 382, 383, 384 and 385 can provide additional global routing resources.

In FIG. 3, the power rails 304 and 306 are positioned along the periphery of the digital blocks 305 and 307. Stated another way, the power rails 304 and 306 are situated along the outermost periphery of the outermost electronic elements within the digital blocks 305 and 307. In some examples, however, the power rails may be located farther inside the digital blocks 305 and 307 than shown in FIG. 3 to increase the space available for routing layers, such as met layers. Referring to FIG. 4, for instance, modified power rails 304' and 306' are positioned farther inside (i.e., closer to a center of) the digital block 305 than shown in FIG. 3. Similarly, the modified power rails 304' and 306' are positioned farther inside the digital block 307 than shown in FIG. 3. This positioning provides additional space to facilitate the inclusion of additional routing layers, such as the met layer 381. In some embodiments, the modified power rails are more proximate to a center of a digital block than they are to an outermost periphery of an outermost electronic element within that digital block. Other power rails 308', 310', 312', and 314' may be similarly positioned power rail.

Figure 5:
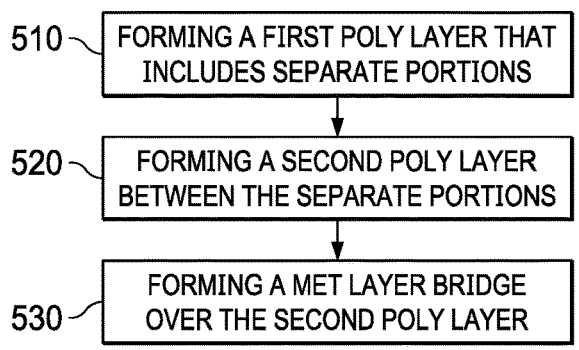
FIG. 5 is a flow diagram illustrating fabrication steps that can be performed to fabricate different portions of a poly port layer.

FIG. 5 depicts a flow diagram 500 illustrating fabrication steps that can be performed to fabricate different portions of a poly port layer. The method 500 is now described in tandem with FIG. 1, and each step of the method 500 may be performed in a fabrication facility producing an IC with the above-described modified layout architecture. The method 500 begins with the step 510, which includes forming a first poly layer (e.g., poly port layer) that includes separate portions. In some examples, this step can be performed after forming the diffused layers 150 and 160. Fabricating the first poly layer may include depositing a polysilicon on a substrate and then creating separate portions by spinning a photoresist, exposing the photoresist through a mask. Forming the first poly layer may also include etching some portion of the photoresist. A transistor is formed at each point of crossing of the first poly layer and the diffused layers 150 and 160.

The method 500 continues with step 520 that includes forming a second poly layer (e.g., poly access layer 125) between the separate portions generated in the step 510. Similar to the step 510, fabricating the second poly layer may include depositing a polysilicon on a substrate and then spinning a photoresist. The fabrication process may also include exposing the photoresist through a mask. Further, the fabrication process of the second poly layer may also include etching some portion of the photoresist. The method 500 further continues in step 530 with forming a met layer bridge over the second poly layer such that the pair of the multiple separate portions are electrically coupled to each other and such that the met layer bridge is electrically isolated from the second poly layer.

The aforementioned met layer bridge can include, e.g., the met layer 122, which may be formed using the steps described in steps 510 and step 520. Fabricating the met layer bridge may include depositing a metal (e.g., copper) on a substrate and exposing a photoresist through a mask. Forming the met bridge layer may also include etching a portion of the photoresist. The method 500 may next include forming a third poly layer that electrically couples to the second poly layer. The aforementioned third poly layer may be the poly routing layer 370 (described in FIG. 3) coupling with the poly access layer 125. Fabricating the poly routing layer 370 may include depositing a metal, photoresist spinning, exposing, and etching.

The examples disclosed above are directed toward an apparatus (such as an integrated circuit) that is fabricated by employing masks that are designed using layouts constructed using the cell-based methodology. Stated another way, the cell-based layouts facilitate the formation of masks, which are further employed to fabricate the apparatus. A "digital block," as that term is used herein, may not be readily identifiable in the fabricated apparatus. Thus, identification of a digital block in the fabricated apparatus may require reference to the corresponding cell-based layout used to design the apparatus.

What is claimed is:

1. A device comprising:
a semiconductor substrate including a doped region;
a digital block defined on the substrate and having multiple electronic elements;
first and second poly layers coupling to the multiple electronic elements, the first and second poly layers extending in parallel through the digital block in a first direction, and the second poly layer including first and second portions electrically coupled to each other via a metal layer; and
a third poly layer coupled to the first poly layer and extending through a gap in the second poly layer in a second direction orthogonal to the first direction,
wherein the first poly layer forms a first transistor with a first doped layer including a first point of crossing of the first poly layer and the first doped layer, and wherein the first poly layer forms a second transistor with a second doped layer at a second point of crossing of the first poly layer and the second doped layer.

2. The device of claim 1, wherein the metal layer is in a first plane above a second plane in which the second poly layer is positioned.

3. The device of claim 1, further comprising first and second power rails configured to provide power to the digital block.

4. The device of claim 1, wherein the second poly layer forms a third transistor with the first doped layer including a third point of crossing of the second poly layer and the second doped layer.

5. The device of claim 1, further comprising a fourth poly layer connected to the second poly layer and extending in the second direction, the second and fourth poly layers extending through a gap in a fifth poly layer that extends in the first direction.

6. The device of claim 1, further comprising a metal layer extending in the second direction through the gap in the second poly layer.

7. The device of claim 1, further comprising a metal bridge that connects first and second portions of the second poly layer across the gap in the second poly layer.

8. A device comprising:
a semiconductor substrate including first and second doped regions;
a digital block defined on the substrate and having multiple electronic elements, including a first and a second electronic element;
first and second polysilicon traces respectively coupled to the first and second electronic elements, the first and second polysilicon traces extending in parallel in a first direction, the first polysilicon trace forming a first gate electrode of a first transistor with the first doped region;
a third polysilicon trace extending in the first direction and forming a second gate electrode of a second transistor with the first doped region and a third gate electrode of a third transistor with the second doped region;
a fourth polysilicon trace directly connected to the third polysilicon trace and extending in a second direction different than the first direction and passing between the first and second polysilicon traces; and
a bridge metal trace directly connected to the first and second polysilicon traces and passing over the fourth polysilicon trace.

9. The device of claim 8, wherein the bridge metal trace is in a first metal level above a plane in which the third polysilicon trace is located.

10. The device of claim 8, further comprising a lower metal trace that passes between the bridge metal trace and the fourth polysilicon trace.

11. The device of claim 8, wherein the second direction is orthogonal to the first direction.

12. An integrated circuit, comprising:
a semiconductor substrate including first and second doped regions;
first and second polysilicon traces extending along a first direction, the first polysilicon trace forming a first transistor with the first doped region and the second polysilicon trace forming a second transistor with the second doped region;
a metal bridge that conductively connects the first and second polysilicon traces over a gap between the first and second polysilicon traces; and
a third polysilicon trace that extends through the gap and connects to a fourth polysilicon trace that forms a third transistor with the first doped region.

13. The integrated circuit of claim 12, further comprising a fourth polysilicon layer that extends through the gap.

14. The integrated circuit of claim 12, wherein the first polysilicon trace connects to a first power rail and the second polysilicon trace connects to a second power rail.

15. The integrated circuit of claim 12, wherein the third polysilicon trace extends in a second direction orthogonal to the first direction.

16. The integrated circuit of claim 12, wherein a metal trace extend through the gap.

* * * * *